United States Patent [19]
Augustine et al.

[11] Patent Number: 5,436,914
[45] Date of Patent: Jul. 25, 1995

[54] CONTROL OF NON-RESETTABLE COUNTERS BY MULTIPLE PROCESSES

[75] Inventors: Kurt E. Augustine, Durham; Chih-Wei Chao, Raleigh, both of N.C.; Arthur A. Daniel, Rochester, Minn.; Jacalyn L. Frantz, Cary, N.C.; David N. Jacobson, Durham, N.C.; Keith E. Karlsson; Kathleen D. Lee, both of Raleigh, N.C.; Daniel E. Levenson, Apex, N.C.; Robert E. Moore, Durham, N.C.; Michael Willett, Raleigh, N.C.

[73] Assignee: International Business Machines Corporation, Armonk, N.Y.

[21] Appl. No.: 792,336

[22] Filed: Nov. 8, 1991

[51] Int. Cl.6 .................... H03K 21/38; G05B 23/00; G06F 11/00
[52] U.S. Cl. ...................................... 371/29.1; 377/39
[58] Field of Search ............... 377/13, 16, 39; 371/29.1, 5.1, 25.1, 57.2

[56] References Cited

U.S. PATENT DOCUMENTS

| 4,255,809 | 3/1981 | Hillman | 377/39 X |
| 4,756,013 | 7/1988 | Van Veldhuizen | 377/39 |
| 4,800,562 | 1/1989 | Hicks | 371/5.1 |
| 5,223,827 | 6/1993 | Bell et al. | 340/825.06 |

OTHER PUBLICATIONS

Robert E. Moore, Common Design for Link-Level Counter Management whole document.

*Primary Examiner*—Emanuel T. Voeltz
*Assistant Examiner*—M. Kemper
*Attorney, Agent, or Firm*—John B. Frisone; Gerald R. Woods

[57] ABSTRACT

A plurality of processes share a single set of non-resettable counters which are sampled periodically. Each process maintains a list of counter relationships unique to its own process and compares at each sample time the current sampled counter values with a selected function of previously received counter values for each relationship in its list and establishes a counter reset value which is a selected function of the current sampled value when the previously selected function is satisfied.

9 Claims, 9 Drawing Sheets

CONTROL OF NON-RESETTABLE COUNTERS BY MULTIPLE PROCESSES

FIELD OF THE INVENTION

This invention relates to the management of communication networks in general and more particularly to the sharing of a number of different event counters by a number of different management processes.

BACKGROUND OF THE INVENTION

In the recent past communication networks have become increasingly complex. Data rates have increased from thousands of bits per second to many millions of bits per second. Along with these increases has come a substantial increase in the complexity of the network and the number of devices connected to the network. In many instances network architectures have been specified by one or more standards organization and implemented and or supplied by a number of different manufacturers. In many instances different management functions have or will be provided by different entities.

While the management programs often use the same information to implement their specific function, they invariably treat this information differently. For example, it is desirable to accumulate information about how many messages or frames over some unit of time are traversing a network and how many defective messages are detected as a percent of the total number in order to ascertain the health of the network. On the other hand some or all of this information along with additional information can be used by another management program to ascertain if the network is being fully utilized.

Since each of the management programs has different requirements with respect to the information, e.g., different time periods, ratios or resets, it would be necessary to provide a unique set of event counters for each of the management functions. Such a solution is not practical in those applications where a fairly large number of different management functions are needed as they would place a substantial burden on the implementing system.

SUMMARY OF THE INVENTION

The invention contemplates a device and a method by which a number of management processes are able to share a plurality of event counters comprising:
- a plurality of counters each for accumulating a running count of the occurrence of a different event;
- a plurality of utilization means each having a different set of requirements involving one or more of the counter values accumulated in the plurality of counters: each of said utilization means including;
  first means for sampling the plurality of counters at predetermined intervals and storing the sampled values;
  second means for storing a list of counter relationships unique to the utilization device; and,
  third means for comparing the current counter values with selected function of previously received counter values in accordance with the list of counter relationships stored in the said second means and establishing a counter reset value when the relationship for any counters specified in the list satisfies a listed unique relationship.

DESCRIPTION OF THE PREFERRED EMBODIMENT

Figure 1:
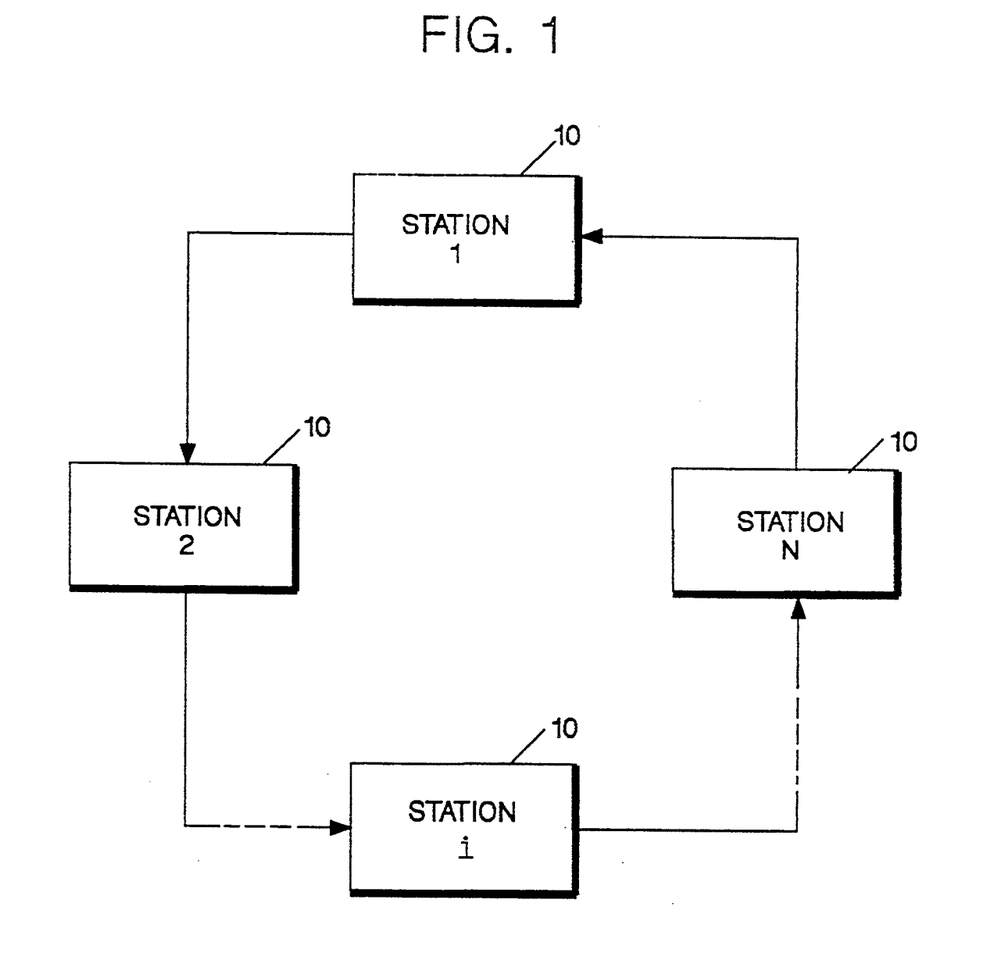
FIG. 1 is a block diagram of a token ring data communication network with which the invention can be used.

The data communication network illustrated in FIG. 1 includes n stations 10 connected in a serial ring circuit. The network is specified in the IEEE 802.5 standard. This standard dictates how the network operates, the format of the data on the network and all significant operations including statistical information concerning network operation. Such a specification is necessary if equipment supplied by different manufacturers are to interoperate. While the token ring network specified by IEEE 802.5 is cited as illustrative it should be noted that the invention is suitable for use in any system including communication networks where statistical data is collected by a plurality of different system managers.

Figure 2:
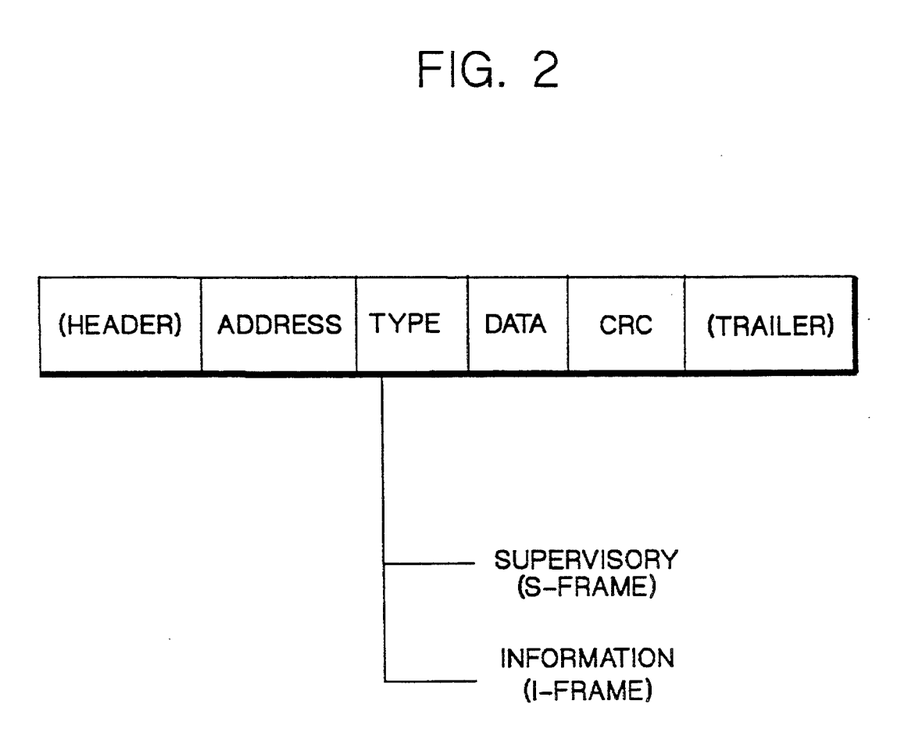
FIG. 2 illustrates the form of a typical data frame.

The typical data frame illustrated in FIG. 2 includes a header field often used to mark or delimit the beginning of the frame. The specific form of this field as well as the others is, in the case of a standard network such as the IEEE 802.5 token ring network, specified by the standards organization. The frame also includes an address field (which often includes both the source and destination address), a data type field (information or supervisory), data, frame check sequence (FCS) or cyclic redundancy check (CRC) character and a trailer field which often includes an end delimiter as well as other information specified in the standard.

Figure 3:
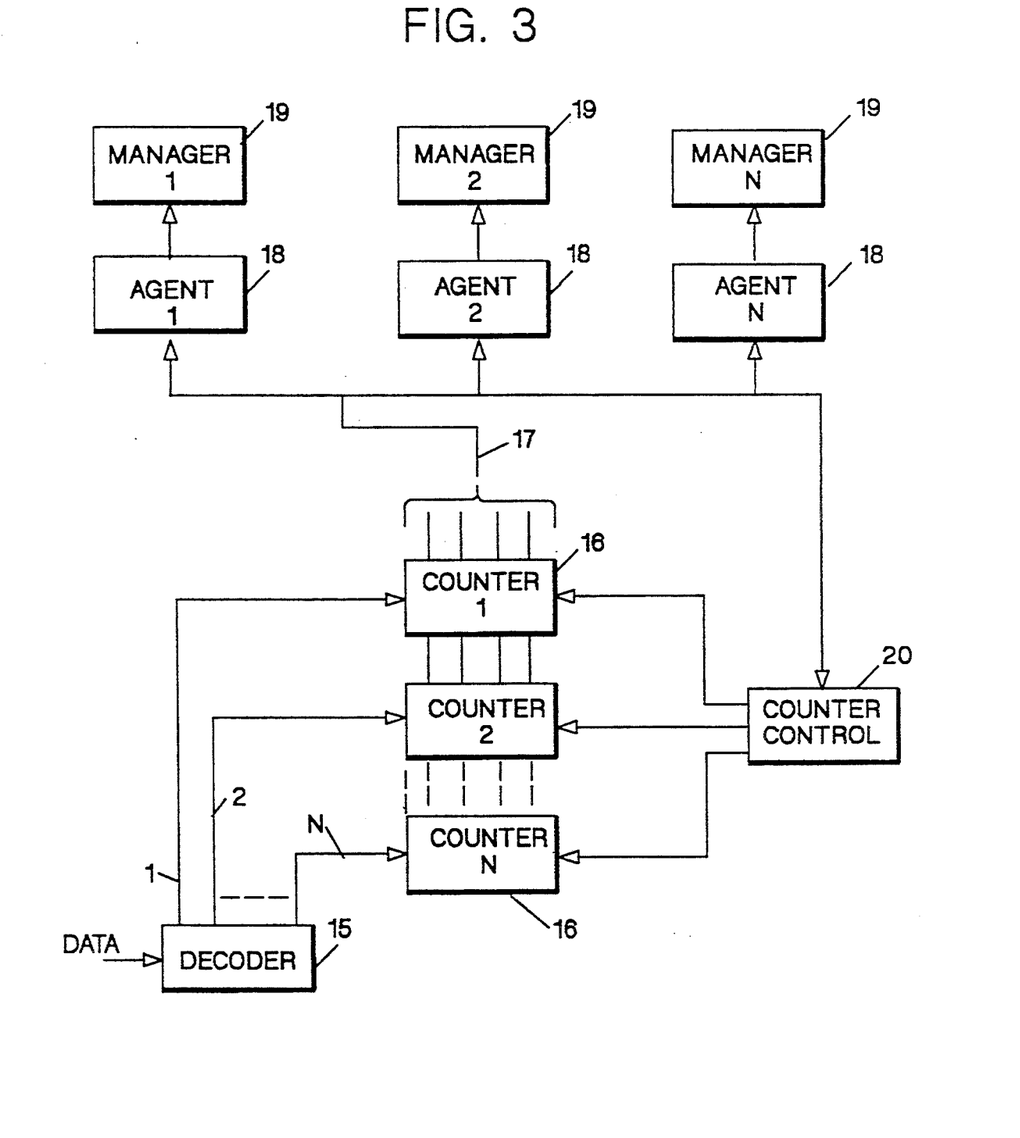
FIG. 3 is a block diagram illustrating the invention.

In FIG. 3 a copy of the data stream is applied to a decoder 15 which examines the data stream in order to detect specific information concerning operation of the network. The decoder 15 provides n outputs, one for each of the conditions being detected. These outputs are applied to n counters 16 which maintain a running count of the conditions or events detected by decoder 15. The outputs of counters 16 are connected in parallel to a bus 17.

A plurality of agents 18 each serving a different process manager 19 are connected to bus 17 and via bus 17 to a counter control 20. Periodically counter control 20 sends, via bus 17, the current values of counters 16 to all of the agents 18. In addition counter control 20 monitors counters 16 and upon detecting a wrap condition (a counter wraps when it makes a transition from its maximum value to zero) in any counter it sends the value of all the counters 16 along with an indication of which counters wrapped to the agents 18. The particular format in which these transmissions are conducted will ordinarily be dictated by the type of device used as the station. For example, an IBM PC would use one protocol while an IBM PS2 would use another.

Figure 4:
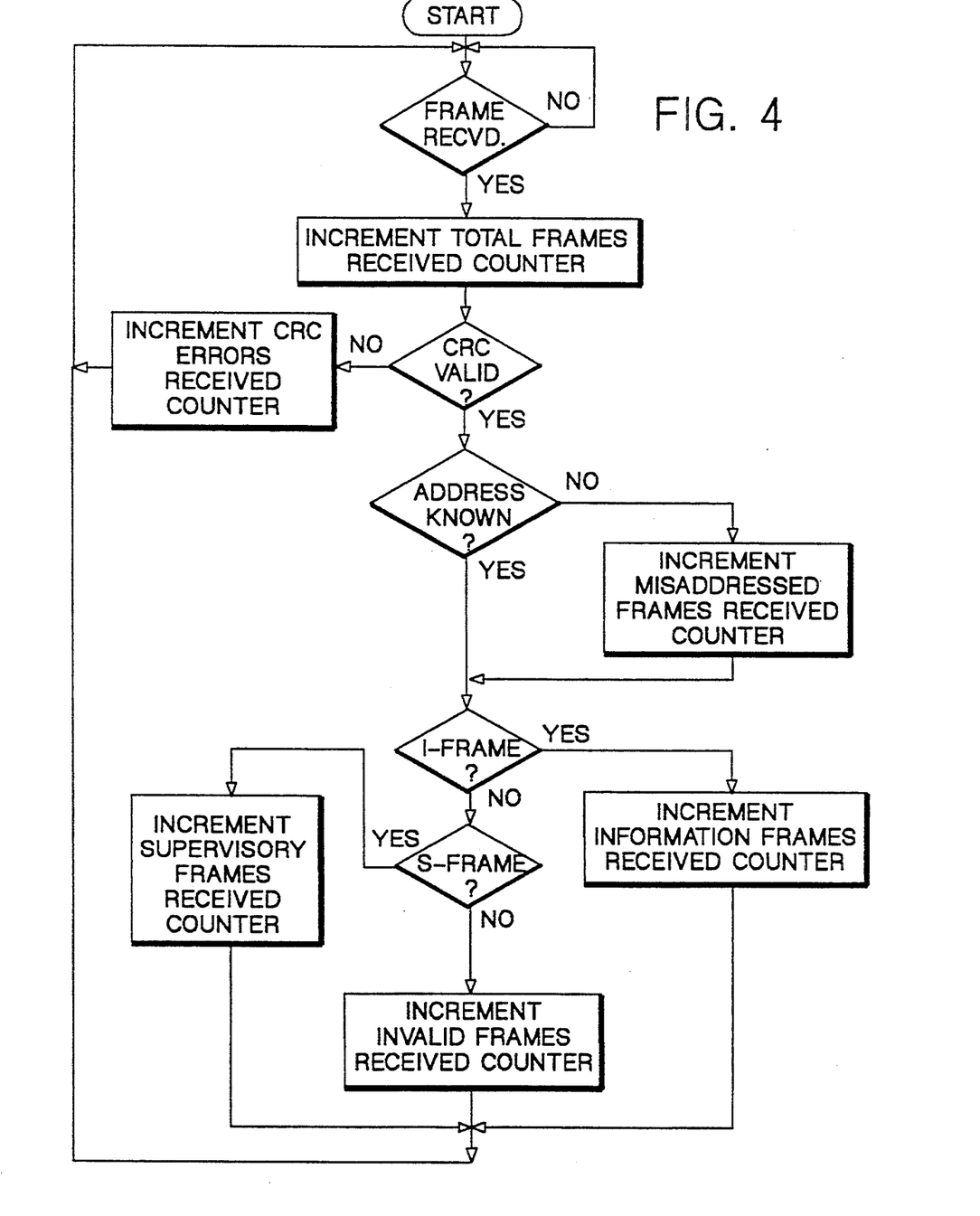
FIGS. 4–8 are flow charts illustrating the operation of the invention.

The flow chart illustrated in FIG. 4 defines the functions performed in decoder 15. A frame is considered received whenever a received header or start delimiter is followed by a trailer or end delimiter. Once this condition is satisfied the counter representing total frames received can be incremented. The cyclic redundancy check field (CRC) is tested for validity. If the CRC is invalid, the CRC error receive counter is incremented and no additional counters are processed for this frame since any information about the frame would be unreliable. Thereafter, the address field is checked and if it is not a recognized or known address the misaddressed counter is incremented. The type field is examined and only one of three counters is incremented. Which one of the three counters is determined by the contents of the data-type field (I,S or neither) and decoder 15 awaits receipt of the next frame whereupon the above described process is repeated for the next frame. The six counters described above are illustrative only and may differ from one network to another.

Figure 4A:
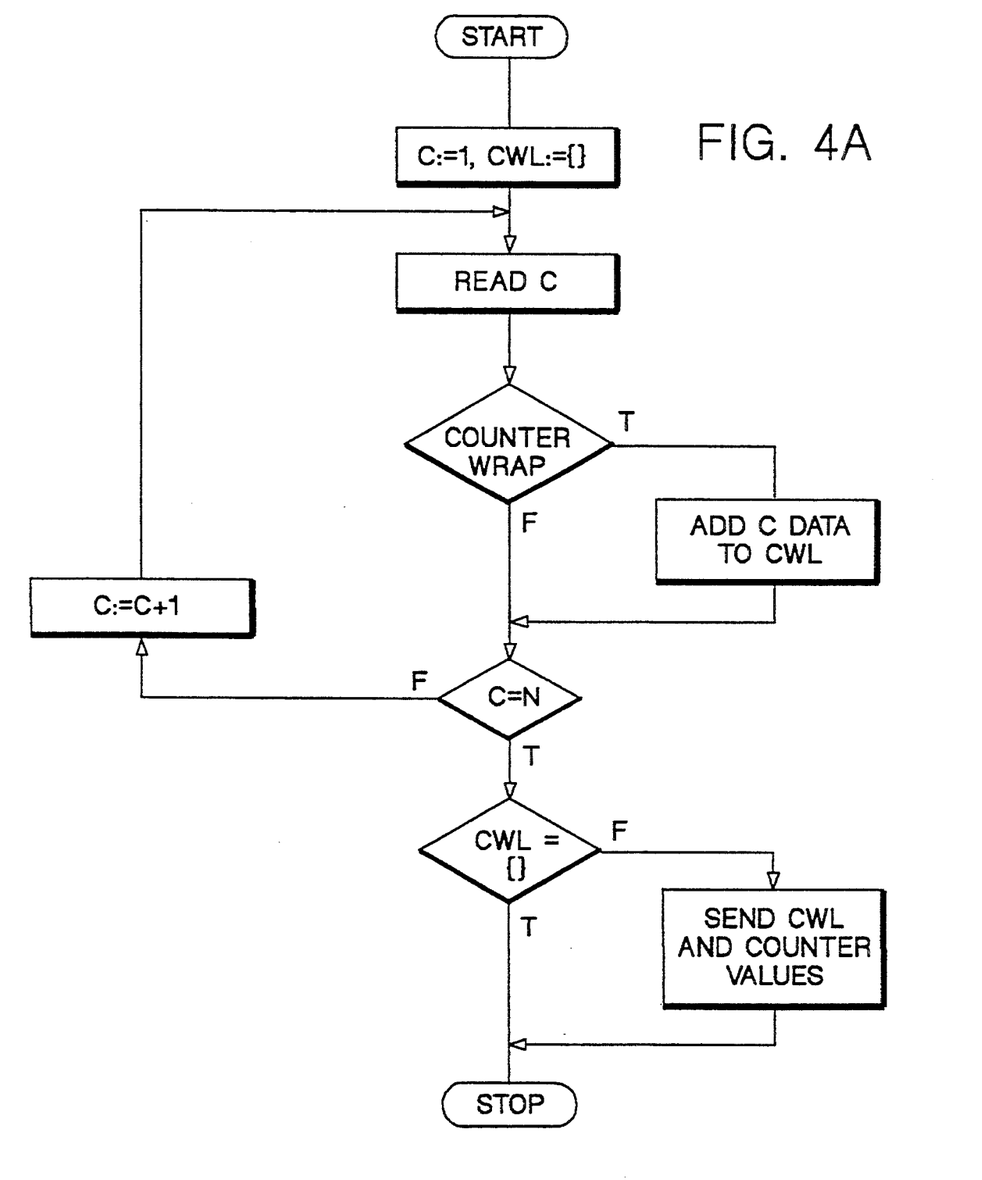

The routine illustrated in FIG. 4A is executed each time a frame is received since this event could cause one or more counters 16 to wrap (i.e., go from its maximum value to zero). Each counter (c) is checked starting with c=1 and a counter wrap list (CWL) is cleared. Each counter value starting with 1 is read and checked to determine if a wrap has taken place. If it has, that information is added to the CWL. This process is repeated for the n counters 16. After all the counters have been tested for the wrap condition the CWL is checked to see if it is empty. If it contains information, the list and the values of all the counters 16 are sent over bus 17 to all agents 18 and the cycle ends.

FIGS. 5-8 illustrate in flow chart form the operations which take place in the agents 18 of FIG. 3. Before any discussion of the flow charts some general observations will help in an understanding of the charts.

This invention makes it possible for multiple managers through their agents to provide statistical reports based on different triggers derived from a single set of counters. The particular triggers specified by the different managers and any action resulting from the reports generated are beyond the scope of this invention which is concerned with the reporting of statistical data based on triggers specified by the manager and based on a single set of non-resettable counters.

A trigger may involve a single threshold relative to a single counter, however, it more commonly involves thresholds concerning pairs of counters. Managers wishing to establish multiple triggers for a single counter set will each create a trigger list (a set of triggers, each of which operates independently of the others). One such trigger could be an error (E) to traffic (T) ratio calculation in a communication network. Assuming the goal is to generate a report whenever the error count exceeds 25% of the traffic count then one need only compute E/T and generate a report when the computed value equals or exceeds 0.25. Hereinafter E will be called the numerator and T the denominator even though an actual division does not take place.

Furthermore, in order to eliminate unnecessary event reports for short term conditions (such as when a single error causes both the E and T counters to have a count of 1), it is specified that E and T must be 50 and 200, respectively. Under these circumstances the agent need only determine which counter reaches its threshold first. If the numerator E reaches 50 before the denominator T reaches 200, then the triggering criterion has been met and the event is reported. This is so even though T has not reached its threshold, since there would have been 50 errors no matter what happens in any ensuing traffic. Therefore, a report is sent and both counters must be reset. However, as previously stated, other agents are using these same counters for different triggers and they can not be reset. The description below will spell out how this is accommodated by the agents. When the denominator T reaches 200 before the numerator E reaches 50, the counters are reset but no report is issued.

In order to accommodate multiple agent/managers none of the counters are actually reset. When a comparison value is reached or exceeded and it is time to begin a new threshold interval, the numerator and denominator counters are effectively reset. That is, the count values remain unchanged, however the agent computes new comparison values (Cx) for both counters by adding offset values (50/200 or $O \times 1/O \times 2$) specified for the threshold pair (i.e., the trigger) to the current value (cx) of the counters to derive the comparison values ($C \times 1/C \times 2$).

While the real counter lengths are selected to accommodate actual operating conditions, they are, however, finite and will wrap when the count exceeds their maximum value. In addition to the counters wrapping, the comparison value Cx can also wrap. This occurs when the offset value Ox when added to the current value cx exceeds the maximum counter value. When a comparison value wraps, a flag is set indicating that the threshold has wrapped and the counter has not. This condition is termed a partial wrap. So long as a threshold is in a partial wrap, the count value must be less than the comparison value (in absolute terms), since the comparison value is one counter pass ahead of the count value. A straight forward comparison of the numerical counter values would yield the wrong answer because a comparison that has wrapped will be numerically less than a count value that has not yet wrapped.

While a threshold is in partial wrap, arithmetic comparison of the comparison value with the count value is suspended since it will yield the wrong answer. However, the partial wrap flag by itself may be reliably taken as an indication that the count value is less than the comparison value. Once the count value wraps, i.e., gets back on the same counter pass as the comparison value, the partial wrap flag is reset and conventional arithmetic comparisons are resumed until another partial wrap occurs.

When a count value is incremented by a large number in a single operation, or it is incremented a number of times during a sample interval, the counter value may wrap prior to a comparison value. This condition, termed a quick wrap, is the inverse of a partial wrap and is noted by a quick wrap flag. Here again an arithmetic comparison yields the wrong answer. If a count value has just wrapped and the comparison value has not, the count value in absolute terms is greater than the comparison value, however, arithmetically the count value will be numerically less than the comparison value since it is one counter pass ahead of the comparison value. Here again the quick wrap flag is used in lieu of the comparison to indicate that the count value exceeds the comparison value and then the counter undergoes an effective reset in which the offset value Ox is added to the counter value cx to derive a new comparison value Cx. This places both the count value and the comparison value on the same counter pass. At this time the quick wrap flag is reset since both are on the same counter pass.

Figure 5:
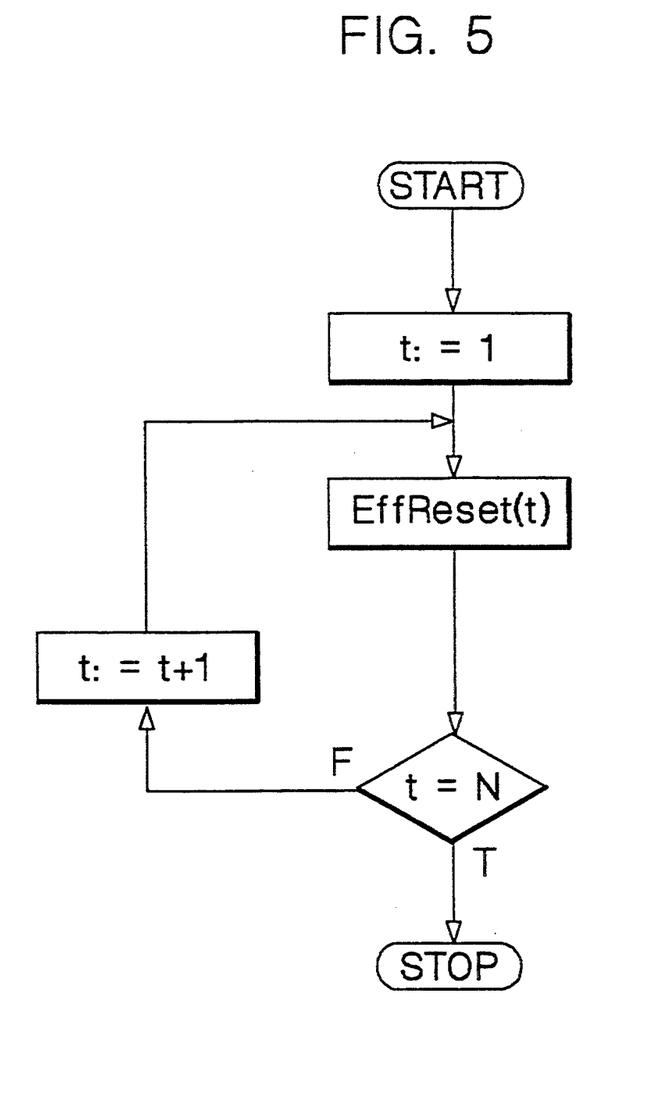

The flow chart illustrated in FIG. 5 covers the initialization of an agent 18. The process described is repeated for each trigger (t). For each trigger an effective reset (illustrated in FIG. 7) is performed. When t=N (where N equals the total number of triggers) the initialization process is complete.

Figure 6:
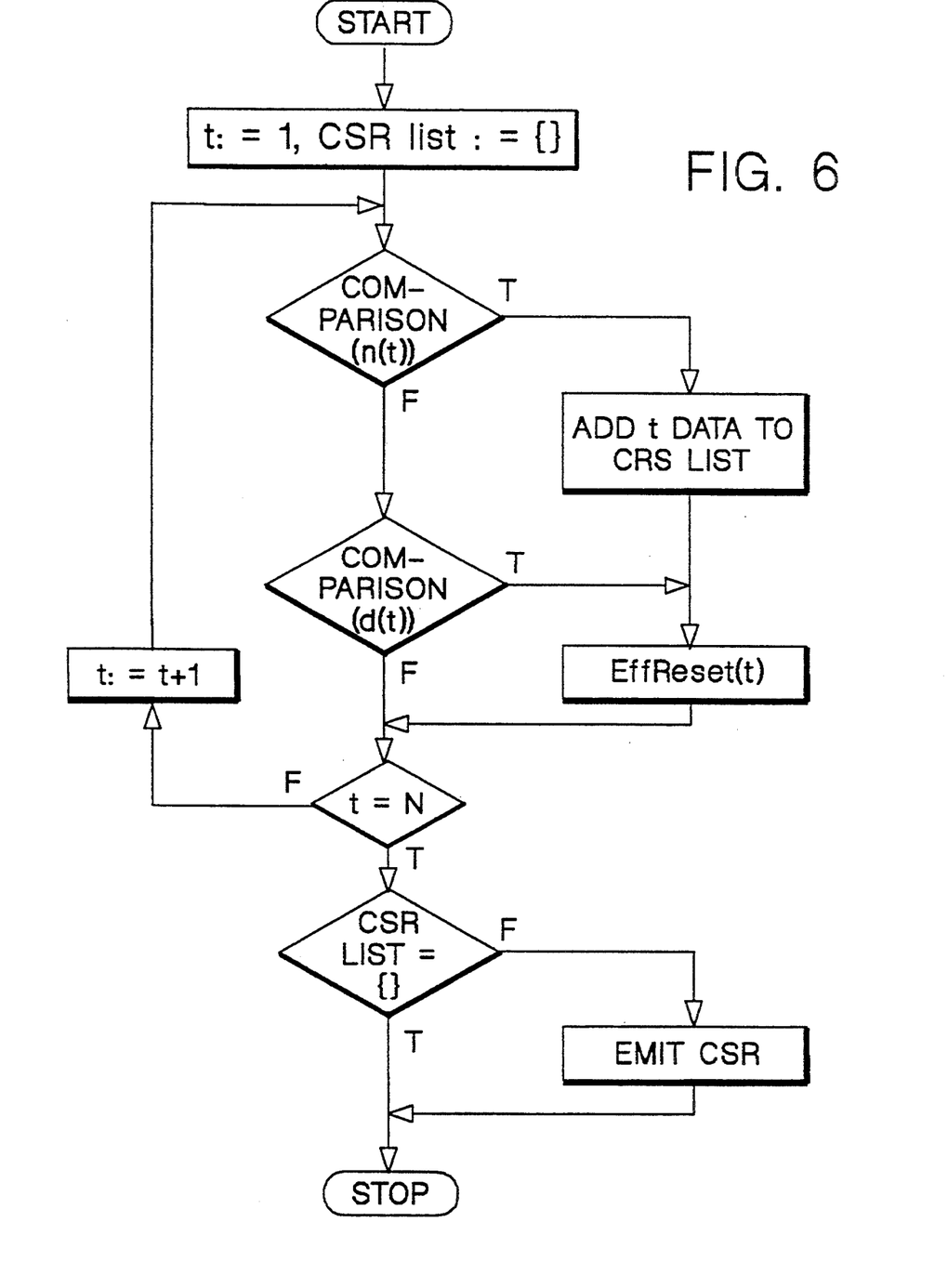

The flow chart illustrated in FIG. 6 is executed at every sample interval for each trigger (t) starting with the first trigger. At the start t is set to 1 and the Counter Set Report list is cleared. During execution each trigger t is processed. A first comparison decision block is used to examine the status of the numerator counter of the current trigger. The partial wrap flag (PW) and the quick wrap flag (QW) are examined. If both QW and PW are off then both the comparison value Cx and the current counter value are on the same counter pass and if the sampled counter value cx is greater than or equal to Cx for the numerator of this trigger then that information is added to the CSR list and an effective reset for the trigger is performed.

If the QW flag is on, the comparison of cx and Cx is not performed and the block is exited as true. If the PW flag is on, no comparison takes place and the block is exited false in which case the same steps are repeated for the denominator counter for the trigger in process. In this instance, if the block is exited true, no data is added to the CSR list but an effective reset is performed.

Following the effective reset or exiting the denominator comparison block false, t is examined and if less than the number of triggers it is incremented in order to repeat the process for the next trigger. When t=n the CSR list is transmitted to the manager if it includes any data.

Figure 7:
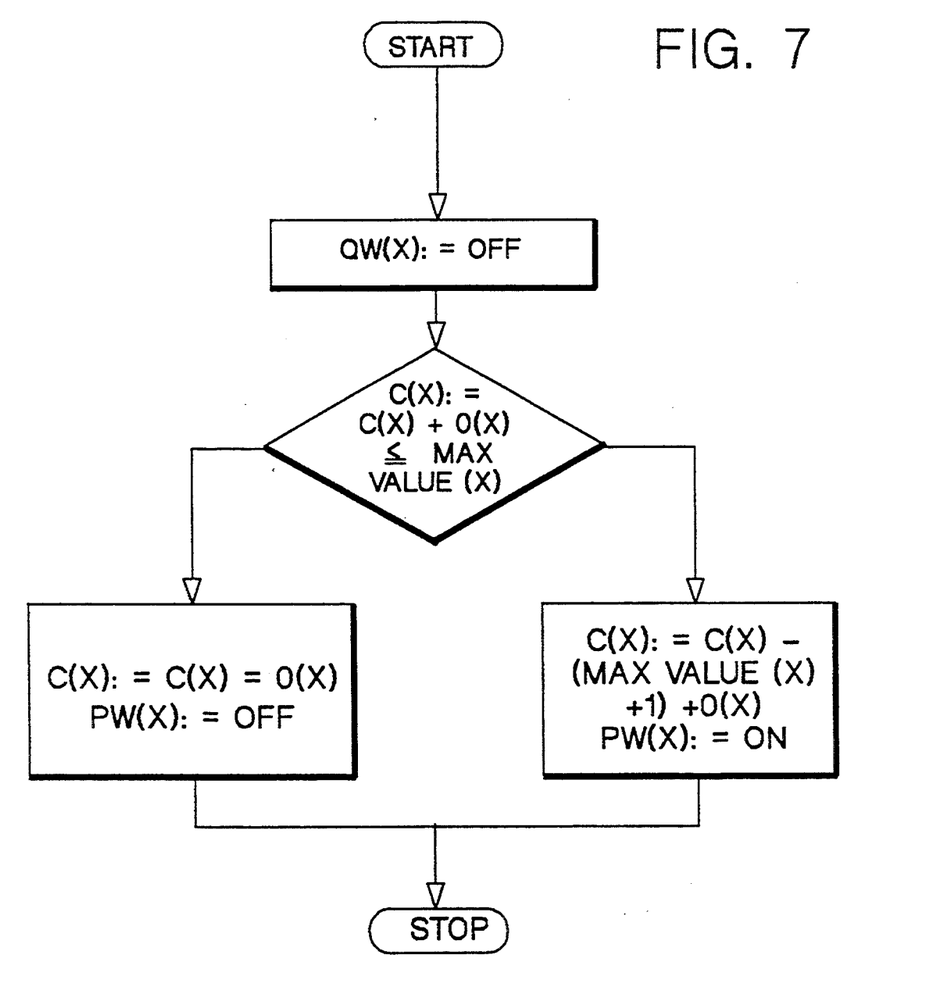

The flow chart illustrated in FIG. 7 shows the effective reset procedure. This procedure is executed for each of the counters in a trigger pair i.e., the numerator counter n(t) and the denominator counter d(t) on successive passes. When this subroutine is called the quick wrap flag (QW) is set to off. The present counter value (cx) plus the offset Ox is compared to the maximum counter value. If the sum exceeds the maximum counter value then the comparison value (Cx) is set equal to current value (cx) minus the maximum counter value plus one plus the offset value (Ox), and the partial wrap flag PW is set to on. This accommodates the counter wrap which takes place when addition of the offset value to the present value exceeds the maximum value or capacity of the counter. If on the other hand the comparison indicates that cx+Ox is less than or equal to the maximum counter value, then Cx is set equal to cx+Ox, and the partial wrap flag PW is set to off. In either instance the process is repeated for each counter in a trigger pair and then end until called again.

Figure 8:
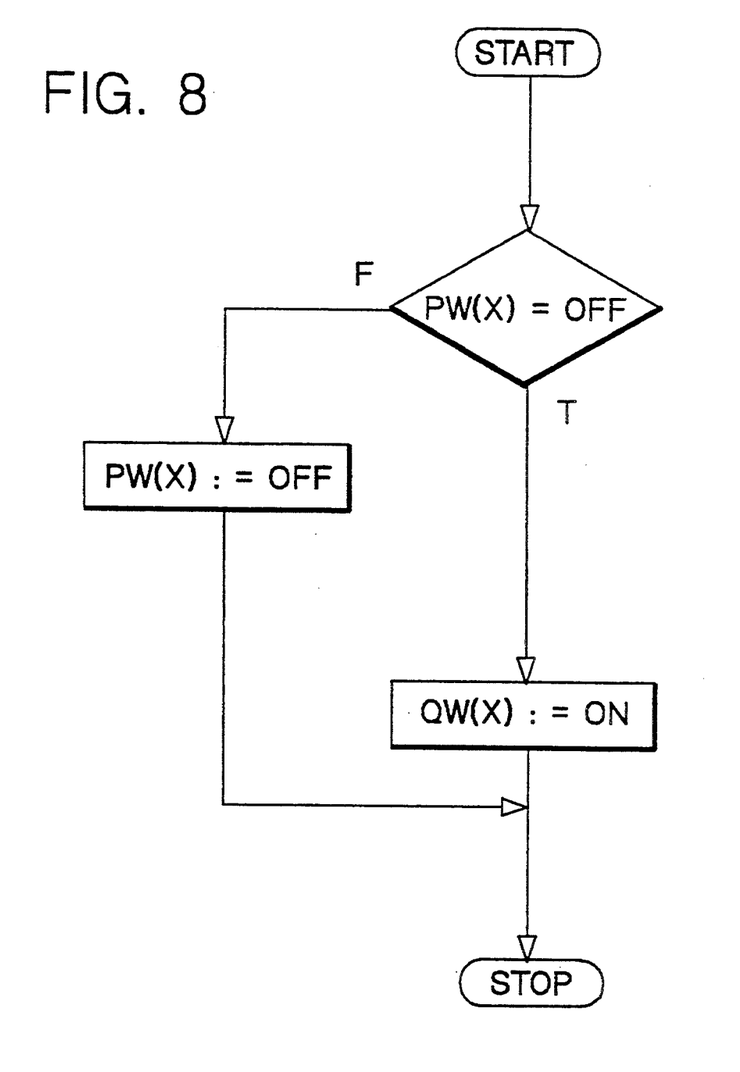

FIG. 8 is a flow chart which illustrates the steps taken when a counter (either numerator or denominator) wraps. If the partial wrap flag for the counter is not off it is turned off since the counter caught up with and is on the same counter pass as the comparison value Cx. If on the other hand the partial wrap flag is off the quick wrap flag is set on since this indicates that the count has exceeded the comparison value Cx (i.e., the comparison value Cx is on an earlier counter pass and therefore is of necessity less than the counter value).

While a single embodiment of the invention has been illustrated and described in detail it will be obvious to those skilled in the art that the invention is suitable for use in applications and environments other than that chosen to illustrate the invention,

We claim:

1. A system for sharing a set of counters amongst a number of management processes comprising:

a plurality of non-resettable finite length wrapped counters each for the occurrence of a different event;

a plurality of utilization means each having a different set of requirements involving one or more of the counter values contained in the plurality of counters: each of said utilization means including;

first means for sampling the plurality of counters at predetermined intervals and storing the sampled values;

second means for storing a list of counter relationships unique to the utilization means; and, third means for comparing a current counter value with a selected function of a previously received counter value in accordance with the corresponding relationship in the list of counter relationships stored in said second means and establishing a counter reset value for the counter when the comparison satisfies the relationship specified in the list stored in the second means.

2. A system as set forth in claim 1 in which the selected function of a previously received counter value includes an offset value added to the previously received value and the specified relationship is satisfied when the current value exceeds the value of the function of the previously received value.

3. A system as set forth in claim 2 in which a first flag is set to ON by the third means when the selected function of the previously received value exceeds the maximum counter value and the specified relationship is deemed not satisfied while the flag is set on.

4. A system as set forth in claim 3 in which a second flag is set to ON when the counter wraps by exceeding its maximum value, if the first flag is set OFF at that time, and the specific relationship is deemed satisfied.

5. A system for sharing a set of counters amongst a number of management processes comprising:

a plurality of non-resettable finite length wrapped counters each for continuously counting the occurrence of a different event;

a plurality of utilization means each having a different set of requirements at least one of which includes a predetermined relationship between two different non-resettable counters, each of said utilization means including:

first means for sampling the plurality of non-resettable counters at predetermined intervals and storing the sampled values;

second means for storing the relationship of the said at least two non-resettable counters, said relationship including a comparison value for each said counter which is derived by adding a predetermined offset value for each counter to a previously sampled value of the counters; and, third means for detecting a predetermined relationship between a current counter sampled value and the stored comparison value for that counter.

6. A system as set forth in claim 5 in which the detection of the predetermined relationship in one of the said two counters initiates the preparation of a counter set report and an effective counter reset; and the detection of the predetermined relationship in the other of said counters initiates an effective counter reset only.

7. A system as set forth in claim 6 in which a counter reset is effected by adding the said offset value to the current counter value for each of the counters.

8. A system as set forth in claim 7 in which a first flag is set to ON when the sum of the offset value and current counter value exceed the maximum value of the counter and on a subsequent sample the third means for detecting the predetermined relationship between the current counter value and the stored comparison value is disabled as long as the first flag is set to ON.

9. A system as set forth in claim 8 in which a second flag is set to ON when a counter wraps and the third means for detecting the predetermined relationship between the current counter value and the stored comparison value is taken as true regardless of the actual current counter value and a counter reset is initiated.

* * * * *